(12) United States Patent
Abe et al.

(10) Patent No.: US 7,388,157 B2
(45) Date of Patent: Jun. 17, 2008

(54) PRINTED WIRING BOARD

(75) Inventors: Tomoyuki Abe, Kawasaki (JP);
Nobuyuki Hayashi, Kawasaki (JP);
Motoaki Tani, Kawasaki (JP);
Kenichiro Abe, Kawasaki (JP); Kenji Iida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/320,965

(22) Filed: Dec. 30, 2005

(65) Prior Publication Data
US 2006/0108147 A1 May 25, 2006

Related U.S. Application Data

(63) Continuation of application No. PCT/JP03/11989, filed on Sep. 19, 2003.

(51) Int. Cl.
*H05K 1/03* (2006.01)

(52) U.S. Cl. .................. 174/256; 174/255; 174/262

(58) Field of Classification Search ............. 174/260, 174/262, 255, 256, 258, 264; 361/760, 792, 361/793, 794, 795
See application file for complete search history.

(56) References Cited

U.S. PATENT DOCUMENTS

| | | | | |
|---|---|---|---|---|
| 4,591,659 | A | | 5/1986 | Leibowitz |
| 4,812,792 | A | * | 3/1989 | Leibowitz .................. 333/238 |
| 5,103,293 | A | * | 4/1992 | Bonafino et al. ........... 257/702 |
| 5,375,042 | A | * | 12/1994 | Arima et al. ............... 361/784 |
| 5,953,213 | A | * | 9/1999 | Napierala .................. 361/760 |
| 6,222,740 | B1 | * | 4/2001 | Bovensiepen et al. ...... 361/795 |
| 6,329,603 | B1 | * | 12/2001 | Japp et al. .................. 174/255 |
| 6,869,664 | B2 | * | 3/2005 | Vasoya et al. .............. 428/209 |
| 6,869,665 | B2 | | 3/2005 | Tani et al. |
| 2003/0136577 | A1 | | 7/2003 | Abe |
| 2004/0040738 | A1 | | 3/2004 | Tani et al. |

FOREIGN PATENT DOCUMENTS

| | | |
|---|---|---|
| EP | 0898311 A2 | 8/1998 |
| JP | 7-249847 | 9/1995 |
| JP | 8-111584 | 4/1996 |
| JP | 8-125060 | 5/1996 |
| JP | 11-40902 | 2/1999 |
| JP | 11-67960 | 3/1999 |
| JP | 2000-138453 | 5/2000 |
| JP | 2001-332828 | 11/2001 |

OTHER PUBLICATIONS

Japanese Patent Office Action, mailed Apr. 24, 2007 and issued in corresponding Japanese Patent Application No. 2005-509052

* cited by examiner

*Primary Examiner*—Ishwar (I. B.) Patel
(74) *Attorney, Agent, or Firm*—Staas & Halsey LLP (57) ABSTRACT

A printed wiring board is made of first and second substrates superimposed on each other. The first and second substrates respectively include a core layer made of resin containing carbon fibers. The second substrate has the outline different from that of the first substrate. A stepped surface is defined on the front surface at least of the first substrate. Electrodes can be formed on the stepped surface as well as on the back surface of the first substrate and the front surface of the second substrate. This structure enables detection of an electric signal from the stepped surface. A further flexibility can thus be achieved in locating electrodes as compared with a conventional printed wiring board having uniform substrates simply superimposed on each other. This results in an expanded use or purpose for a printed wiring board.

10 Claims, 8 Drawing Sheets

PRINTED WIRING BOARD

CROSS-REFERENCE TO RELATED APPLICATIONS

This application is a continuation application of International Application PCT/JP2003/011989, filed Sep. 19, 2003, the contents of all of which being incorporated herein by reference.

BACKGROUND OF THE INVENTION

1. Field of the Invention

The present invention relates to a printed wiring board including core layers made of resin containing carbon fiber or fibers and a method of making the same.

2. Description of the Prior Art

A printed wiring board including a core layer made of resin containing carbon fibers is well known as disclosed in Japanese Patent Application Publication No. 2001-332828. A core layer is superimposed on a core layer in the disclosed printed wiring board. The core layers serve to reduce the thermal expansion of the entire printed wiring board.

The upper surface of the lower core layer receives the lower surface of the upper core layer in the printed wiring board of the type. Since both the core layers are formed in a uniform shape, the upper surface of the lower core layer is completely covered with the lower surface of the upper core layer, while the lower surface of the upper core layer is completely covered with the upper surface of the lower core layer. Electrodes can be formed only on the lower surface of the lower core layer as well as the upper surface of the upper core layer.

SUMMARY OF THE INVENTION

It is accordingly an object of the present invention to provide a printed wiring board contributing to a further flexibility in locating electrodes so as to realize an expanded use. It is also an object of the present invention to provide a printed wiring board capable of realizing a finer wiring structure with less influence of thermal expansion.

According to a first aspect of the present invention, there is provided a printed wiring board comprising: a first substrate including a core layer made of resin containing carbon fibers; and a second substrate superimposed on the front surface of the first substrate, said second substrate including a core layer made of resin containing carbon fibers, said second substrate having the outline different from the outline of the first substrate.

The printed wiring board allows the first and second substrates having the outlines different from each other. Accordingly, a stepped surface is defined on the surface at least of the first substrate. Electrodes can be formed on the stepped surface as well as on the back surface of the first substrate and the front surface of the second substrate. This structure enables detection of an electric signal from the stepped surface. A further flexibility can thus be achieved in locating electrodes as compared with a conventional printed wiring board having uniform substrates simply superimposed on each other. This results in an expanded use or purpose for a printed wiring board. The printed wiring board accepts the second substrate located inside the outline of the first substrate.

The first and second core layers contain the carbon fibers. The carbon fibers serve to suppress the thermal expansion of the first and second substrates. The electrodes are thus prevented from shifting regardless of any change in temperature. It should also be noted that the carbon fibers cost less than ceramic.

The core layer of the second substrate may comprise: a first resin layer made of a resin material containing carbon fibers, the first resin layer defining a through hole at a predetermined position; an insulating layer overlaid on the surface of the first resin layer, the insulating layer made of a resin material containing glass fibers; and a second resin layer overlaid on the surface of the insulating layer, the second resin layer made of a resin material containing carbon fibers. The second resin layer may be designed to define a through hole at a position aligned with the through hole defined in the first resin layer.

The printed wiring board may further comprise a buildup layer overlaid on the front surface of the second substrate. In this case, the buildup layer may include an insulating layer and an electrically-conductive pattern. The buildup layer serves to make electrodes finer. The printed wiring board is thus capable of adjusting to finer electrodes of an electronic component mounted on the printed wiring board. Finer electrodes cannot be established in a conventional printed wiring board made of a multilayered structure made of prepregs containing glass fibers. Such a printed wiring board hardly adjusts to finer electrodes of an electronic component. An electrically-conductive pad may be exposed on the surface of the buildup layer. The first substrate may further comprise: an insulating layer overlaid on the surface of the core layer, the insulating layer containing glass fibers; and an electrically-conductive pattern located on the surface of the insulating layer.

A specific method may be provided to make the printed wiring board. The method may comprise: superimposing a first substrate on a second substrate including a core layer containing carbon fibers, the first substrate including a core layer containing carbon fibers; and carving the outline of the first substrate inside the outline of the second substrate.

According to a second aspect of the present invention, there is provided a printed wiring board comprising: a first substrate including a core layer made of resin containing carbon fibers; a second substrate superimposed on the front surface of the first substrate, said second substrate including a core layer made of resin containing carbon fibers; and a buildup layer superimposed on the front surface of the second substrate, the buildup layer including an insulating layer and an electrically-conductive pattern.

The printed wiring board realizes suppression of the thermal expansion of the first and second substrates due to employment of the carbon fibers. Electrodes are thus prevented from shifting regardless of any change in temperature. It should also be noted that the carbon fibers cost less than ceramic. The buildup layer serves to make electrodes finer. The printed wiring board is thus capable of adjusting to finer electrodes of an electronic component mounted on the printed wiring board.

The core layer of the second substrate may comprise: a first resin layer made of a resin material containing carbon fibers, the first resin layer defining a through hole at a predetermined position; an insulating layer overlaid on the surface of the first resin layer, the insulating layer made of a resin material containing glass fibers; and a second resin layer overlaid on the surface of the insulating layer, the second resin layer made of a resin material containing carbon fibers. The second resin layer may be designed to define a through hole at a position aligned with the through hole defined in the first resin layer. An electrically-conductive pad may be exposed on the surface of the buildup layer.

The first substrate may further comprise: an insulating layer overlaid on the surface of the first core layer, the insulating layer containing glass fibers; and an electrically-conductive pattern located on the surface of the insulating layer.

A specific method may be provided to make the printed wiring board. In this case, the method may comprise: preparing at least two fiber reinforced resin plates defining a through hole, respectively; interposing a resin sheet between the fiber reinforced resin plates; and urging one of the fiber reinforced resin plates to the other of the fiber reinforced resin plates while heat is applied at least to the resin sheet, so that the through hole is filled up with the resin material contained in the resin sheet.

The method enables the resin material contained in the resin sheet to flow into the through hole defined in the fiber reinforced resin plates. The through hole can reliably be filled with the resin material. This results in prevention of generation of a void. An electrically-conductive through hole may thereafter be formed inside the through hole. The inner surface of the through hole is subjected to plating. A resin filler material is fully filled in a space between the outer surface of the electrically-conductive throughhole and the fiber reinforced resin plates, so that the plated material on the inner surface of the through hole can completely be insulated from the fiber reinforced resin plates. The fiber reinforced resin plates may contain carbon fibers, for example.

A conventional method employs a pair of fiber reinforced resin plates bonded together. A through hole is then formed at a predetermined position of the bonded fiber reinforced resin plates. In this case, a void or voids tend to be generated inside the through hole. The plated material tends to flow into the void or voids inside the through hole. This results in an unintentional electrical connection between the plated material and the carbon fibers contained in the fiber reinforced resin plates. The plated material thus cannot be insulated from the carbon fibers.

BRIEF DESCRIPTION OF THE DRAWINGS

The above and other objects, features and advantages of the present invention will become apparent from the following description of the preferred embodiment in conjunction with the accompanying drawings, wherein.

DESCRIPTION OF THE PREFERRED EMBODIMENT

Figure 1:
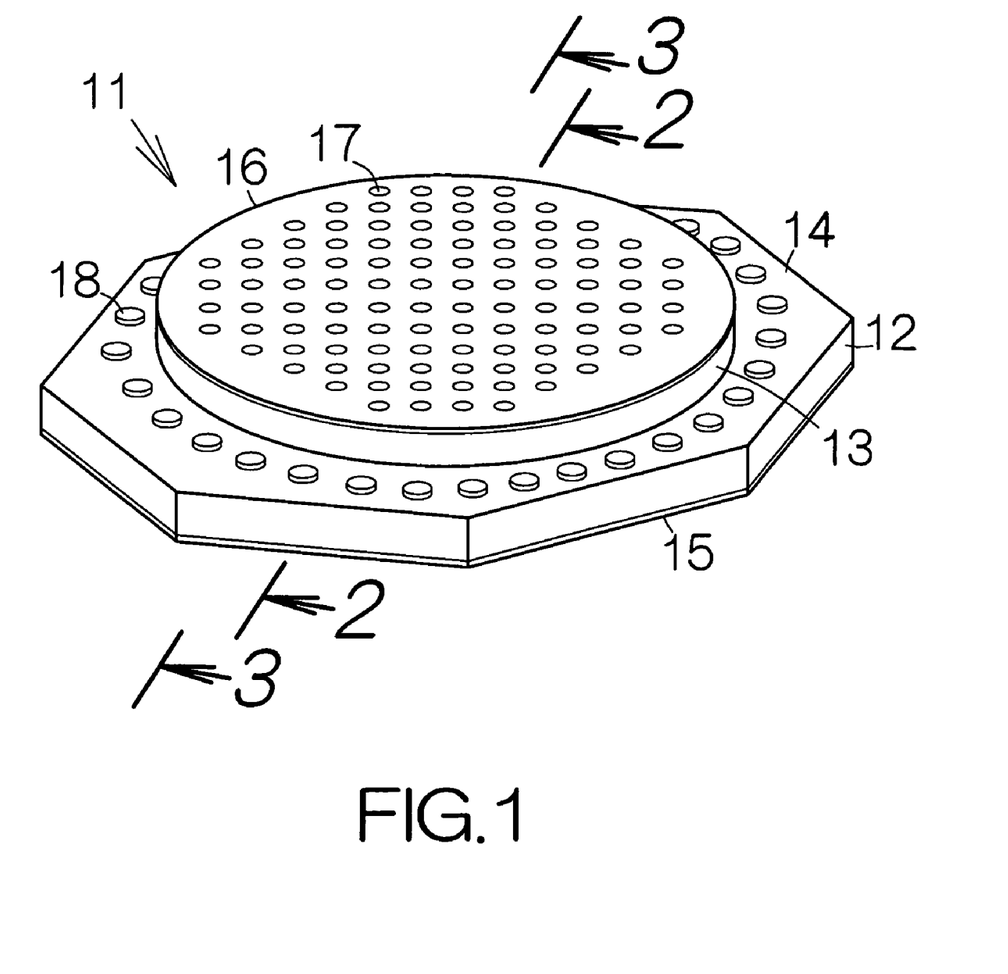
FIG. 1 is a perspective view schematically illustrating the appearance of a printed wiring board or probe card according to a specific example of the present invention.

FIG. 1 schematically illustrates the appearance of a printed wiring board or probe card 11 according to a specific example of the present invention. The probe card 11 includes a first substrate 12 and a second substrate 13 located on the front surface of the first substrate 12. The outline of the second substrate 13 is set different from that of the first substrate 12. The second substrate 13 is located inside the outline of the first substrate 12. Accordingly, a stepped surface 14 is defined at a place adjacent to the second substrate 13 on the front surface of the first substrate 12. In this case, the outline of the first substrate 12 is shaped in an octagon, for example. The outline of the second substrate 13 is shaped in a circle. The diameter of the second substrate 13 is set at 200 mm, for example. Alternatively, the first and second substrates 12, 13 may be formed in any other shape as long as the second substrate 13 is located inside the outline of the first substrate 12.

A buildup layer 15 is overlaid on the back surface of the first substrate 12. A buildup layer 16 is also overlaid on the front surface of the second substrate 13. Electrically-conductive pads 17 are exposed on both the exposed surfaces of the buildup layers 15, 16. Electrically-conductive pads 18 are likewise exposed on the front surface of the first substrate 12, namely on the stepped surface 14. The electrically-conductive pads 17, 18 may be made of an electrically-conductive material such as copper.

Figure 2:
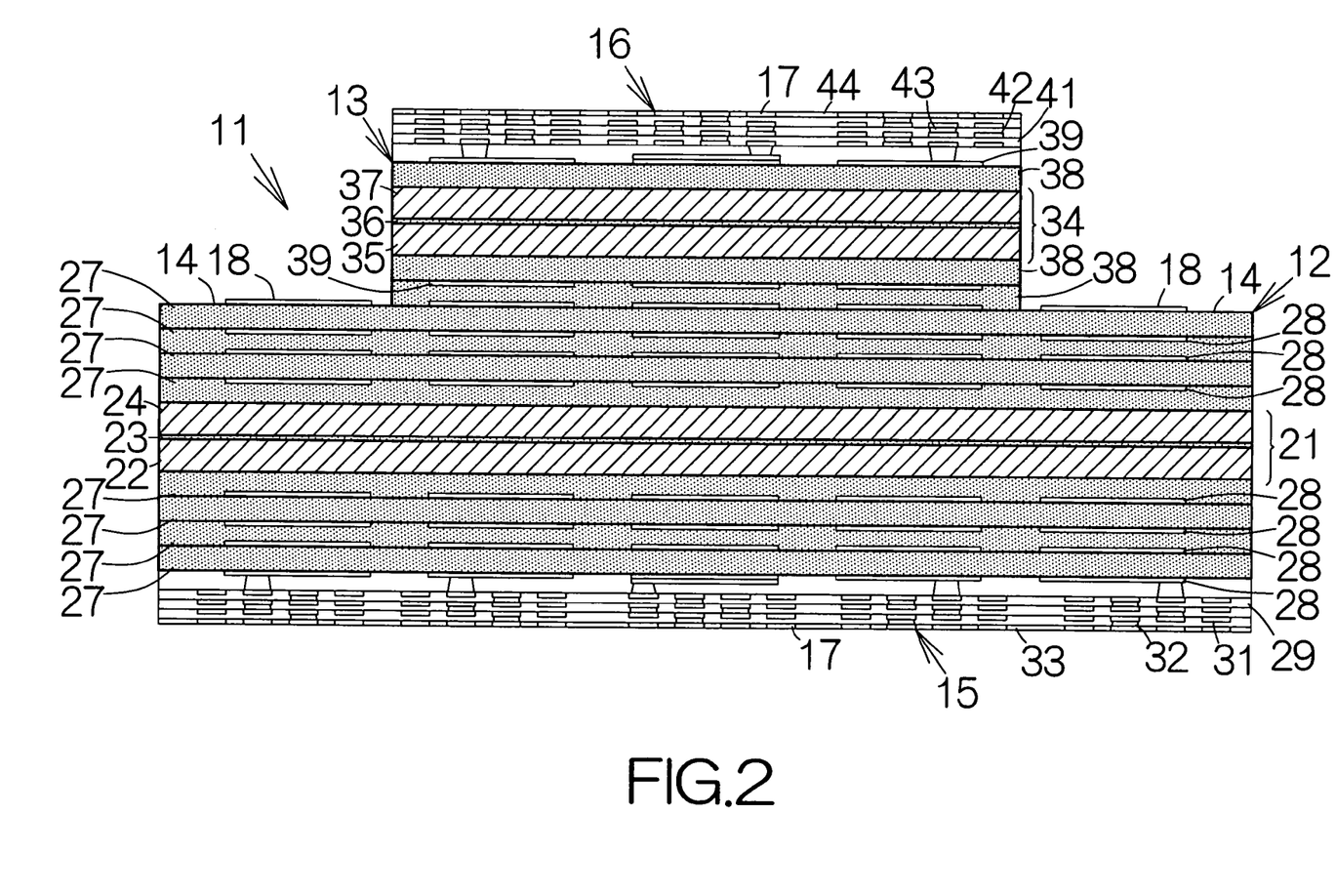
FIG. 2 is an enlarged vertical sectional view taken along the line 2-2 in FIG. 1.

As shown in FIG. 2, the first substrate 12 includes a first core layer 21, in the form of a flat plate, made of resin containing carbon fibers. The first core layer 21 includes a first resin layer 22 in the form of a flat plate. An insulating layer 23 is overlaid on the surface of the first resin layer 22. A second resin layer 24 in the form of a flat plate is overlaid on the surface of the insulating layer 23. The first and second resin layers 22, 24 are made of a resin material containing carbon fiber cloth. The carbon fiber cloth is plain woven from carbon fiber yarn. The carbon fiber yarn is made of a bunch of 1,000 carbon fibers or more. The diameter of the individual carbon fiber is set equal to or smaller than 10 μm. Alternatively, the carbon fiber cloth may be replaced with mesh or nonwoven, both made of carbon fibers, in the first and second resin layers 22, 24. The carbon fiber cloth may extend over the entire extent of the first and second resin layers 22, 24. The carbon fibers may be contained in the first and second resin layers 22, 24, respectively, at the content ranging from 30% by volume to 80% by volume approximately. The carbon fibers at the rate equal to 99% or larger may be graphitized in the entire carbon fibers. Epoxy resin is employed as a resin material for the first and second resin layers 22, 24, for example. The insulating layer 23 is made of a resin material containing glass fiber cloth. The glass fiber cloth may extend over the entire extent of the insulating layer 23. Epoxy resin is employed as a resin material for the insulating layer 23, for example.

Four of insulating layers 27 are overlaid on both the front and back surfaces of the first core layer 21, respectively, for example. The insulating layer 27 is made of a resin material containing glass fiber cloth. The glass fiber cloth may extend over the entire extent of the insulating layer 27. Epoxy resin is employed as a resin material for the insulating layers 27. Electrically-conductive patterns 28 are located between the adjacent insulating layers 27. The electrically-conductive patterns 28 may be made of an electrically-conductive material such as copper, for example.

The buildup layer 15 includes a multilayered structure film having insulating layers 29 and electrically-conductive patterns 31. The insulating layers 29 and electrically-conductive patterns 31 are alternately overlaid on one another. The insulating layer 29 may be made of an epoxy resin, for example. The electrically-conductive patterns 31 may be made of an electrically-conductive material such as copper, for example. Vias 32 may be employed to establish electric connection between the adjacent electrically-conductive patterns 31 across the insulating layer 29. The aforementioned electrically-conductive pads 17 are exposed on the surface of the buildup layer 15. An overcoat layer 33 covers over the surface of the buildup layer 15 except places corresponding to the electrically-conductive pads 17. The overcoat layer 33 may be made of a resin material, for example.

The second substrate 13 includes a second core layer 34, in the form of a flat plate, made of resin containing carbon fibers. The second core layer 34 includes a first resin layer 35 in the form of a flat plate. An insulating layer 36 is overlaid on the surface of the first resin layer 35. A second resin layer 37 in the form of a flat plate is overlaid on the surface of the insulating layer 36. The first and second resin layers 35, 37 may have the structure identical to that of the aforementioned first and second resin layers 22, 24. The insulating layer 36 may likewise have the structure identical to that of the aforementioned insulating layer 23.

An insulating layer 38 covers over both the front and back surfaces of the second core layer 34, respectively. The insulating layer 38 is made of a resin material containing glass fiber cloth. The glass fiber cloth may extend over the entire extent of the insulating layer 38. Epoxy resin is employed as a resin material for the insulating layer 38. Electrically-conductive patterns 39 are located on the surface of the insulating layer 38. The electrically-conductive patterns 39 may be made of an electrically-conductive material such as copper, for example.

The buildup layer 16 includes a multilayered structure film having insulating layers 41 and electrically-conductive patterns 42. The insulating layers 41 and electrically-conductive patterns 42 are alternately overlaid on one another. The insulating layer 41 may be made of epoxy resin, for example. The electrically-conductive patterns 42 may be made of an electrically-conductive material such as copper, for example. Vias 43 are employed to establish electric connection between the adjacent electrically-conductive patterns 42 across the insulating layer 41. The aforementioned electrically-conductive pads 17 are exposed on the surface of the buildup layer 16. An overcoat layer 44 covers over the surface of the buildup layer 16 except places corresponding to the electrically-conductive pads 17. The overcoat layer 44 may be made of a resin material, for example.

Figure 3:
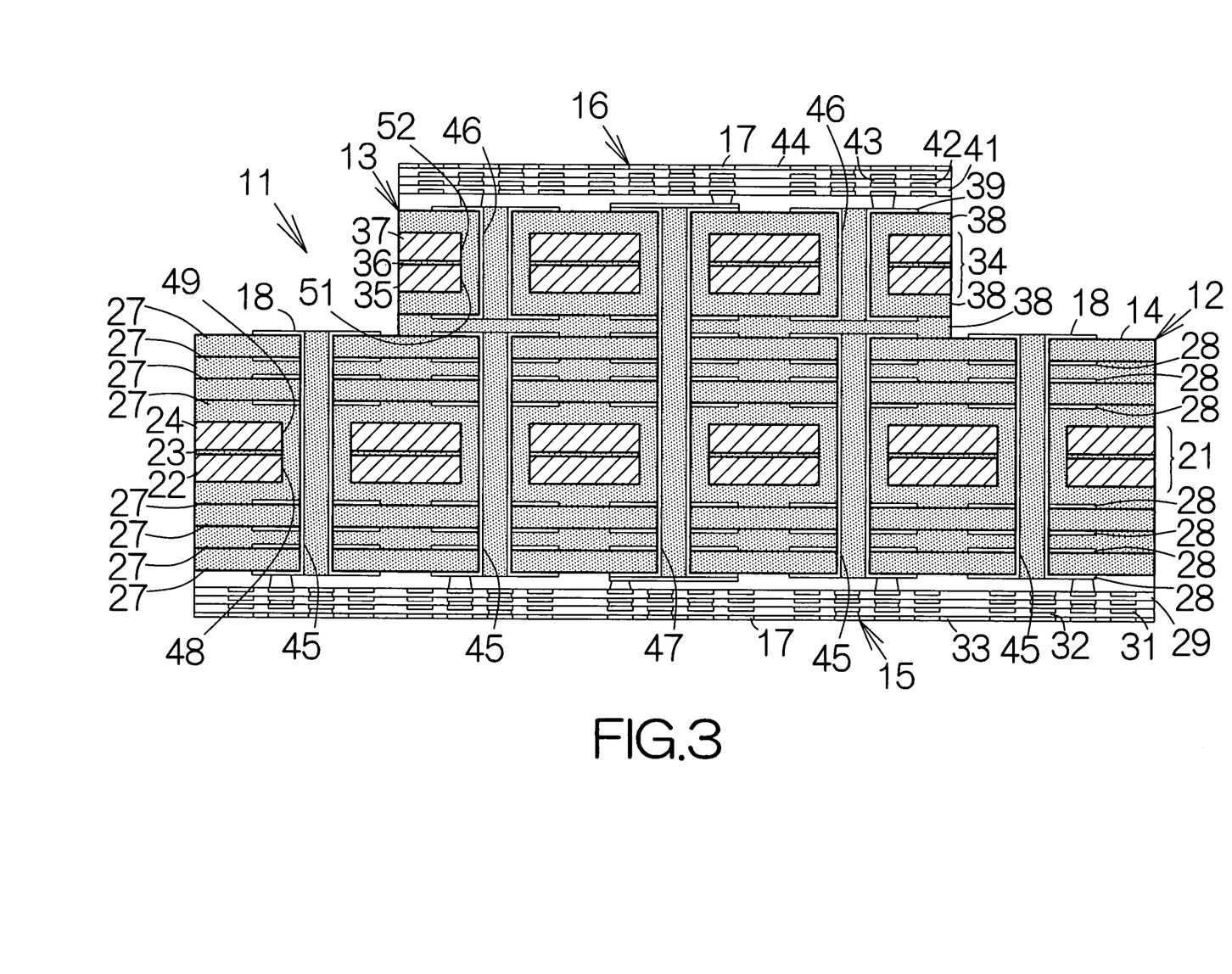
FIG. 3 is an enlarged vertical sectional view taken along the line 3-3 in FIG. 1.

As shown in FIG. 3, a through-hole via or vias 45 are formed in the first substrate 12. The through-hole vias 45 are designed to penetrate through the first substrate 12 between the front and back surfaces. A through-hole via or vias 46 are likewise formed in the second substrate 13. The through-hole vias 46 are designed to penetrate through the second substrate 13 between the front and back surfaces. A through-hole via 47 is also formed in the first and second substrates 12, 13. The through-hole via 47 is designed to penetrate through the first and second substrates 12, 13. The through-hole vias 45, 46, 47 are made of an electrically-conductive material such as copper. The inside space of the through-hole vias 45, 46, 47 may be filled up with a resin material such as epoxy resin, for example. The through-hole vias 45, 46, 47 serve to establish an electrical connection between the electrically-conductive patterns 28, 28, . . . 39, 39.

Through holes 48 are defined in the first resin layer 22 of the first substrate 12 at predetermined positions. Through holes 49 are likewise defined in the second resin layer 24 of the first substrate 12 at predetermined positions. The individual through holes 49 are aligned with the corresponding through holes 48. Through holes 51 are also defined in the first resin layer 35 of the second substrate 13 at predetermined positions. Through holes 52 are likewise defined in the second resin layer 37 of the second substrate 13 at predetermined positions. The individual through holes 52 are aligned with the corresponding through holes 51. The through-hole via 45 is designed to penetrate through the through holes 48, 49. The through-hole via 46 is designed to penetrate through the through holes 51, 52. The through-hole via 47 is designed to penetrate through the through holes 48, 49, 51, 52. An insulating filler material fills a space between the outer surfaces of the through-hole vias 45, 46, 47 and the inner surfaces of the through holes 48, 49, 51, 52. A resin material such as epoxy resin may be employed as the insulating filler material. The insulating filler material serves to establish a reliable insulation between the through-hole vias 45, 46, 47 and the carbon fiber cloth contained in the first and second resin layers 22, 24, 35, 37.

The probe card 11 is allowed to accept the first and second resin layers 22, 24, 35, 37 and insulating layers 23, 27, 29, 36, 38, 41 made of a resin material selected from a group consisting of epoxy, polysulfone, polyethersulfone, polyphenylsulfone, polyphthalamide, polyamideimide, polyketone, polyacetal, polyimide, polycarbonate, modified polyphenylene ether, polyphenyleneoxide, polybutylene terephthalate, polyacrylate, polyphenylenesulfide, polyetheretherketone, tetrafluoroethylene, cyanate ester and bismaleimide, for example. Alternatively, any combination of those may be employed as a resin material, for example.

The probe card 11 is mounted on a probe apparatus, not shown. The back surface of the first substrate 12 is received on the probe apparatus. The electrically-conductive pads 17 are thus connected to electrically-conductive terminals of the probe apparatus. A semiconductor wafer, not shown, is received on the front surface of the second substrate 13 or buildup layer 16, for example. The electrically-conductive pads 17 are connected to electrically-conductive bumps of the semiconductor wafer. Electric current is supplied to semiconductor wafer from the probe apparatus via the probe card 11. The temperature of the semiconductor wafer changes in response to the supply of electric current. Electric signals are thus detected from the semiconductor wafer based on the supplied electric current. The electrically-conductive pads 18 on the stepped surface 14 may also be utilized in the detection of the electric signals, for example. The semiconductor wafer is in this manner inspected. The electrically-conductive pads 17 on the surface of the buildup layer 15 may be located at positions corresponding to the electrically-conductive terminals of the probe apparatus, for example. The electrically-conductive pads 17 on the surface of the buildup layer 16 may be located at positions corresponding to the electrically-conductive bumps of the semiconductor wafer, for example.

The buildup layers 15, 16 serve to make the electrically-conductive pads 17 or electrodes finer in the probe card 11 of this type. The probe card 11 is thus capable of adjusting to finer electrodes of a semiconductor wafer, for example. A finer wiring structure cannot be established in a conventional printed wiring board made of a multilayered structure including prepregs containing glass fibers. Such a printed wiring board hardly adjusts to finer electrodes of a semiconductor wafer.

Carbon fiber cloth is contained in both the first and second core layers 21, 34 in the probe card 11. The carbon fiber cloth serves to suppress thermal expansion of the first and second substrates 12, 13. The coefficient of expansion of the first and second substrates 12, 13 can be set equivalent to that of the semiconductor wafer. The electrically-conductive pads 17 is reliably prevented from shifting from the positions corresponding to the electrically-conductive bumps of the semiconductor wafer regardless of any change in temperature. In other words, the electrically-conductive pads 17 can be kept aligned with the electrically-conductive bumps of the semiconductor wafer. In particular, the through-hole via 47 extending between the first and second substrates 12, 13 serves to suppress change in the electric resistance. If a ceramic substrate is mounted on a first substrate in a conventional manner, ball terminals are utilized to couple the ceramic substrate to the first substrate. Shifts of the ball terminals relative to the first substrate or the ceramic substrate causes a change in the electric resistance. Furthermore, the carbon fiber cloth costs less than ceramic.

The outline of the second substrate 13 is set different from that of the first substrate 12 in the probe card 11. Accordingly, the stepped surface 14 is defined on the front surface of the first substrate 12. The electrically-conductive pads 18 or electrodes can thus be formed on the stepped surface 14 as well as the back surface of the first substrate 12 and the front surface of the second substrate 13. Electric signals can be taken out from the stepped surface 14. A further flexibility can be achieved in locating electrodes as compared with a conventional printed wiring board having uniform substrates simply superposed on each other. This results in an expanded use or purpose for a printed wiring board.

Next, description will be made on a method of making the probe card 11. The first and second core layers 21, 34 are first formed. Sheets of carbon fiber cloth are prepared. The carbon fiber cloth is plain woven from carbon fiber yarn. The carbon fiber yarn is made of a bunch of 1,000 carbon fibers or more. The diameter of the individual carbon fibers is set equal to or smaller than 10 μm, for example. The carbon fiber cloth is dipped into epoxy resin varnish. The carbon fiber cloth and epoxy resin varnish subsequently get dried. A resin sheet or prepreg containing carbon fiber cloth is in this manner formed. The thickness of the prepreg may be set at 0.15 mm approximately, for example.

Figure 4:
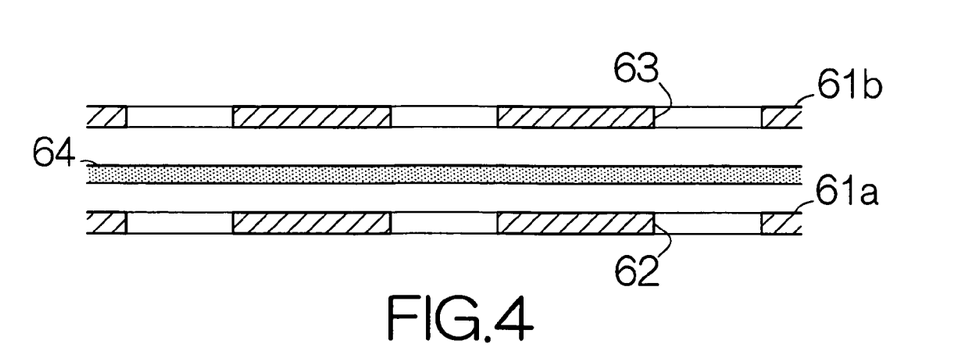
FIG. 4 is an enlarged partial sectional view schematically illustrating the process of interposing a resin sheet between fiber reinforced resin plates.

The prepregs, eight of them in this case, are then superimposed on one another. The uppermost one of the prepregs is pressed to the lowest one under a heated condition. A vacuum press may be employed in this case, for example. The vacuum press keeps pressing for one hour, for example. The peak of the temperature of the applied heat is set at 170 degrees Celsius, for example. As shown in FIG. 4, fiber reinforced resin plates 61a, 61b are in this manner formed. Through holes 62 are formed in the fiber reinforced resin plate 61a at predetermined positions. Through holes 63 are likewise formed in the fiber reinforced resin plate 62b at predetermined positions. A drill is utilized in this case, for example. The diameter of the through holes 62, 63 is set at 0.60 mm approximately, for example. The thickness of the fiber reinforced plates 61a, 61b is set at 1.0 mm approximately, for example.

Figure 5:
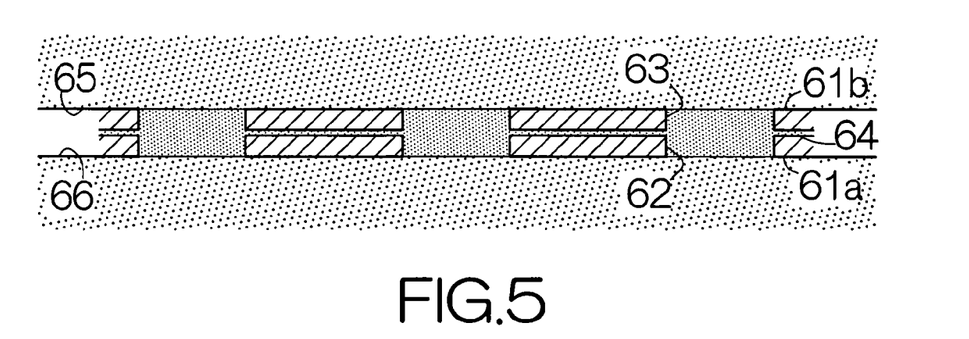
FIG. 5 is an enlarged partial sectional view schematically illustrating the process of urging the fiber reinforced resin plates against each other.

A resin sheet or prepreg 64 is then prepared. The prepreg 64 contains glass fiber cloth. The thickness of the prepreg 64 is set at 0.10 mm approximately, for example. The prepreg 64 is interposed between the fiber reinforced resin plates 61a, 61b. The through holes 62, 63 are aligned with each other. As shown in FIG. 5, the fiber reinforced resin plate 61b is pressed against the fiber reinforced resin plate 61a while heat is applied at least to the prepreg 64. The front surface of the fiber reinforced resin plate 61b receives a flat surface 65. The back surface of the fiber reinforced resin plate 61a is received on a flat surface 66. The flat surfaces 65, 66 serve to close the openings of the through holes 62, 63. A vacuum press is employed for the pressing. The vacuum press keeps pressing for one hour, for example. The peak of the temperature of the applied heat is set at 180 degrees Celsius, for example. The pressure is set at $3.92 \times 10^6$ [Pa], for example. The epoxy resin contained in the prepreg 64 exudes out of the space between the fiber reinforced resin plates 61a, 61b. The epoxy resin fills the through holes 62, 63. The epoxy resin gets hardened within the through holes 62, 63 in response to the applied heat. The first and second core layers 21, 34 are in this manner established. The number of the prepreg 64 may depend on the total volume of the through holes 62, 63 formed in the fiber reinforced resin plates 61a, 61b. Specifically, the volume of the epoxy resin contained in the prepreg 64 should be enough to fill the through holes 62, 63. The number of the prepreg 64 also depends on the density of the through holes 62, 63. It should be noted that the fiber reinforced resin plates 61a, 61b correspond to the first and second resin layers 22, 24, 35, 37. The prepreg 64 corresponds to the insulating layer 23, 36.

Figure 6:
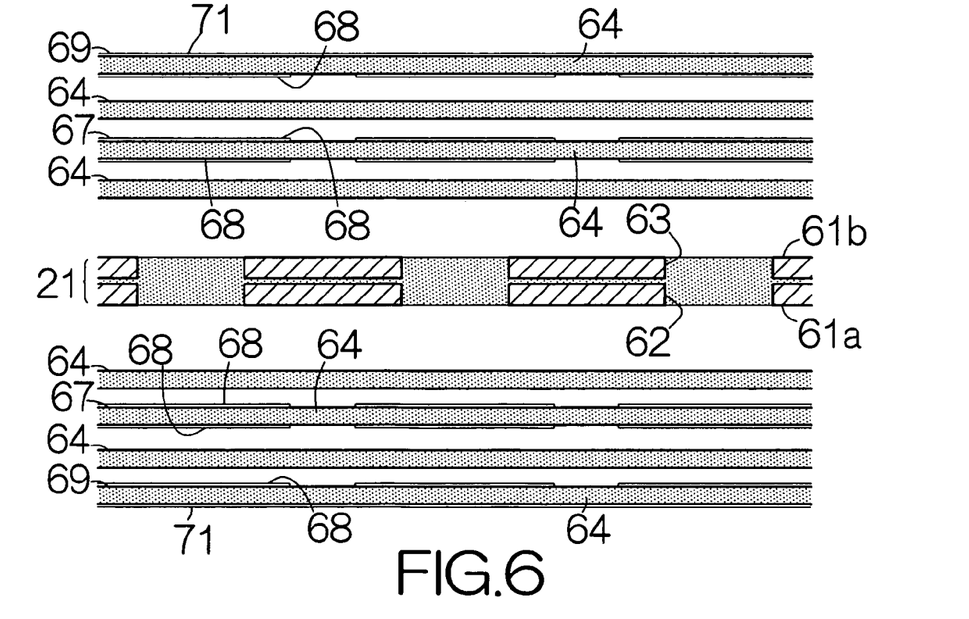
FIG. 6 is an enlarged partial sectional view schematically illustrating the process of interposing a resin sheet between a first core layer and a wiring plate.

The aforementioned prepreg 64 is then overlaid on the front and back surfaces of the first core layer 21 as shown in FIG. 6. A first wiring plate 67 is overlaid on the surface of the individual prepreg 64. The first wiring plate 67 includes the prepreg 64 and electrically-conductive patterns 68 located on the front and back surfaces of the prepreg 64. The thickness of the first wiring plate 67 is set 0.10 mm at approximately, for example. The prepreg 64 is further overlaid on the surface of the individual first wiring plate 67. A second wiring plate 69 is overlaid on the surface of the individual prepreg 64. The second wiring plate 69 includes the prepreg 64, electrically-conductive patterns 68 located on the inward surface of the prepreg 64, and a copper foil 71 located on the outward surface of the prepreg 64. The copper foil 71 may cover over the overall outward surface of the prepreg 64, for example. The thickness of the second wiring plate 69 is set at 0.10 mm approximately, for example. In this case, a subtractive process may be employed for forming the electrically-conductive patterns 68, for example.

Figure 7:
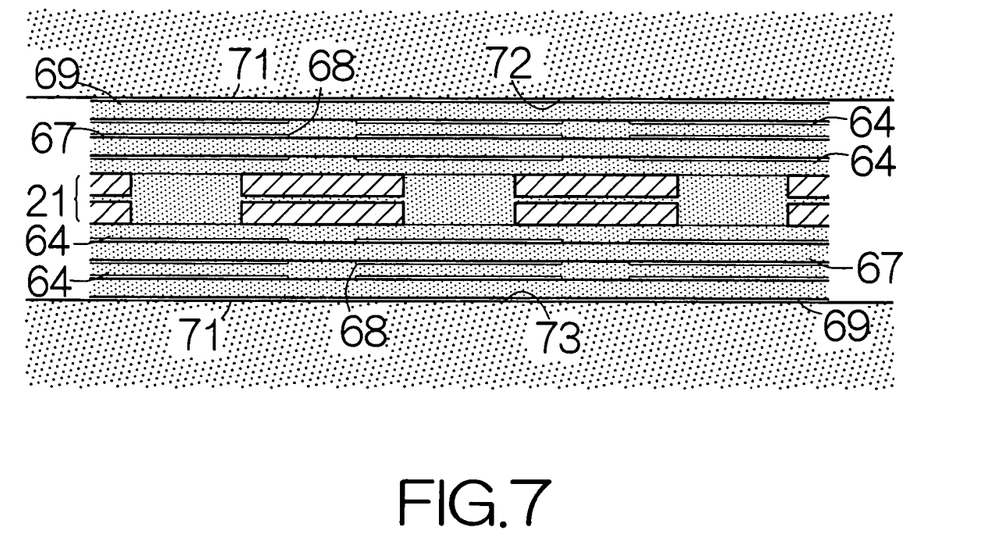
FIG. 7 is an enlarged partial sectional view schematically illustrating the process of urging the resin sheets and the wiring plates against the first core layer.

The first and second wiring plates 67, 69 and the prepregs 64 are then pressed on the front and back surfaces of the first core layer 21 under a heated condition, as shown in FIG. 7. A flat surface 72 is contacted with the copper foil 71 on the front surface of the first core layer 21. A flat surface 73 is likewise contacted with the copper foil 71 on the back surface of the first core layer 21. A vacuum press is employed in this case. The vacuum press keeps pressing for one hour, for example. The peak of the temperature of the applied heat is set at 180 degrees Celsius, for example. The pressure is set at $3.92 \times 10^6$ [Pa], for example. Epoxy resin contained in the prepreg 64 gets hardened in response to the applied heat. The hardened epoxy resin serves to bond the first and second wiring plates 67, 69 to the first core layer 21. The prepregs 64 correspond to the insulating layers 27. The electrically-conductive patterns 68 correspond to the electrically-conductive patterns 28.

Figure 8:
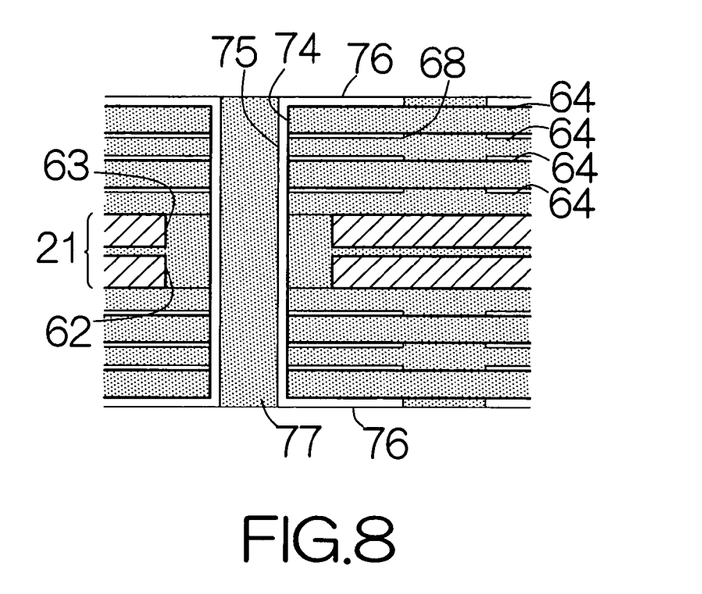
FIG. 8 is an enlarged partial sectional view schematically illustrating the process of forming a through-hole via.

Through holes 74 are then formed as shown in FIG. 8. Resist films, not shown, are first formed on the surfaces of the copper foils 71. The through hole 74 penetrates through the through holes 62, 63. A coaxial relationship is established between the through hole 74 and the through holes 62, 63. A drill is utilized for forming the through holes 74, for example. The diameter of the through hole 74 is set at 0.30 mm approximately, for example. A desmearing process is applied to the inner surfaces of the through holes 74.

A copper layer 75 is then formed over the inner surface of the through hole 74. Electroless plating and electroplating are sequentially effected to form the copper layer 75, for example. The copper layer 75 corresponds to the through-hole via 45. A resin material 77 is then poured into the through holes 74. Epoxy resin solvent is employed as the resin material 77, for example. The resin material 77 is subsequently subjected to heat treatment. The application of heat continues for one hour approximately. The temperature of the applied heat is set at 170 degrees Celsius approximately, for example. The resin material 77 gets hardened in response to the applied heat. A buffing process is then effected to wipe the resin material 77 overflowing the through holes 74. Electrically-conductive patterns 76 are subsequently formed out of the copper foils 71. A resin material is further applied to the surface of the electrically-conductive patterns 76. The first substrate 12 is in this manner established. The thickness of the first substrate 12 is set at 3.8 mm approximately, for example.

Figure 9:
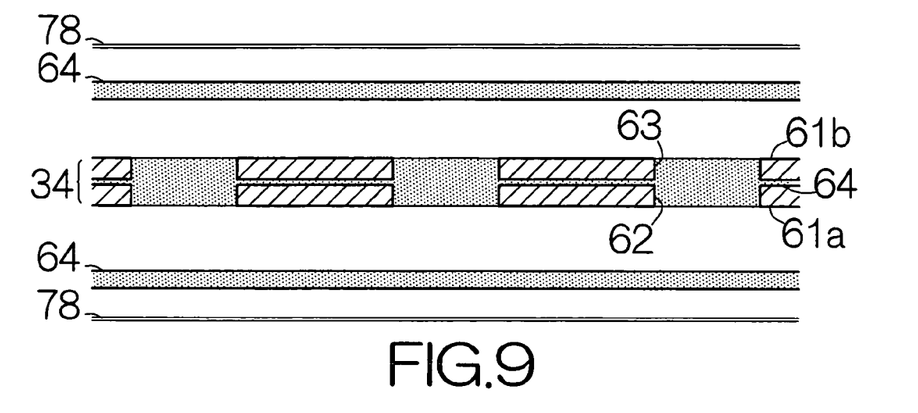
FIG. 9 is an enlarged partial sectional view schematically illustrating the process interposing a resin sheet between a second core layer and a wiring plate.
Figure 10:
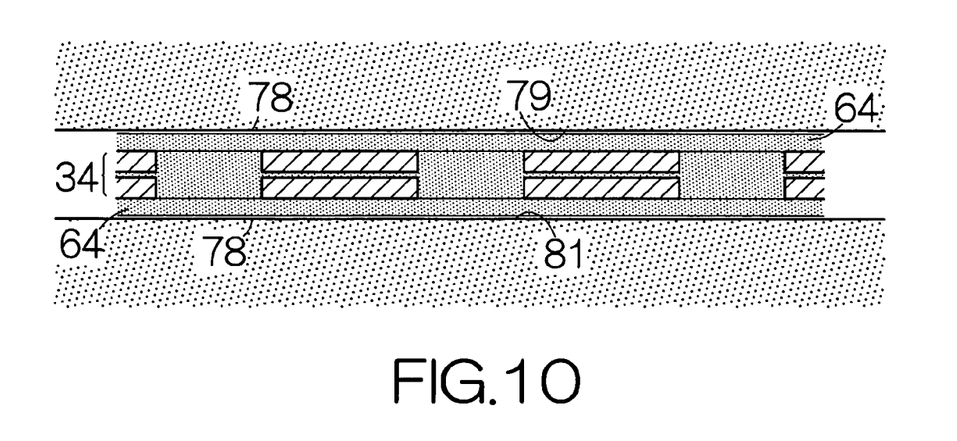
FIG. 10 is an enlarged partial sectional view schematically illustrating the process of urging the resin sheets and the wiring plates against the second core layer.

Next, the prepreg 64 is overlaid on the front and back surfaces of the second core layer 34 as shown in FIG. 9. A copper foil 78 is overlaid on the surface of the individual prepreg 64. The thickness of the copper foil 78 is set at 0.018 mm approximately, for example. The prepreg 64 and the copper foil 78 are pressed against the front and back surfaces of the second core layer 34 under a heated condition, as shown in FIG. 10. A flat surface 79 is contacted with the surface of the copper foil 78 on the front surface of the second core layer 34. A flat surface 81 is likewise contacted with the surface of the copper foil 78 on the back surface of the second core layer 34. A vacuum press is employed. The vacuum press keeps pressing for one hour, for example. The peak of the applied heat is set at 180 degrees Celsius, for example. The pressure is set at $3.92 \times 10^6$ [Pa], for example. Epoxy resin contained in the prepreg 64 gets hardened in response to the applied heat. The hardened epoxy resin serves to bond the copper foil 78 to the second core layer 34. The prepreg 64 corresponds to the insulating layer 38.

Figure 11:
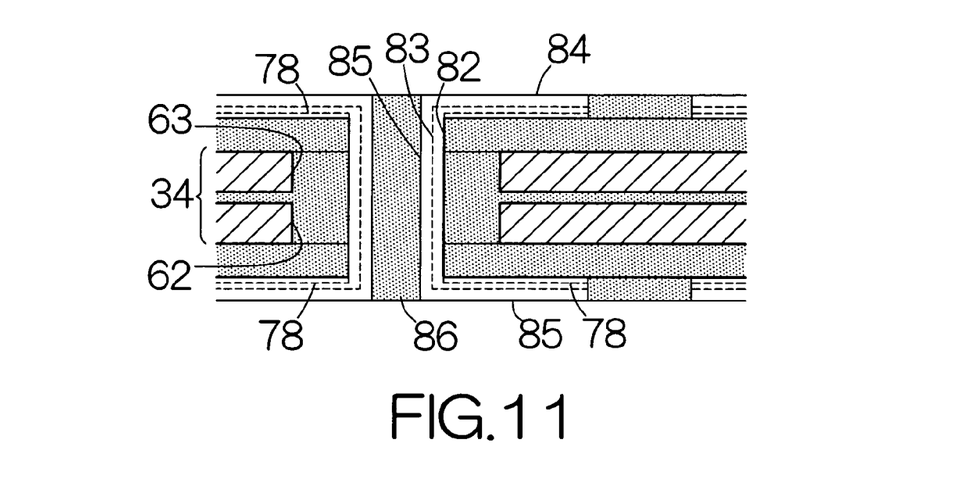
FIG. 11 is an enlarged partial sectional view schematically illustrating the process of forming a through-hole via.

Through holes 82 are then formed as shown in FIG. 11. The copper foil 78 is first subjected to half etching prior to establishment of the through holes 82. The through hole 82 is thereafter formed to penetrate through the through holes 62, 63. A coaxial relationship is established between the through hole 82 and the through holes 62, 63. A drill is utilized for forming the through holes 82, for example. The diameter of the through hole 82 is set at 0.30 mm approximately, for example. A desmearing process is applied to the inner surfaces of the through holes 82.

A copper seed layer 83 is then formed over the inner surfaces of the through holes 82. Electroless plating is employed for forming the copper seed layer 83. A resist film, not shown, is formed to pattern electrically-conductive patterns 84 on the surface of the copper seed layer 83. Photolithography is utilized to pattern the resist film, for example. A copper layer 85 is then plated on the surface of the copper seed layer 83. Electroplating is effected to from the copper layer 85. Etching is subsequently effected to remove the copper foil 78 and the copper seed layer after removal of the resist film. The electrically-conductive patterns 84 and the through-hole vias 46 are in this manner established.

A resin material 86 is then poured into the through holes 82. The resin material 86 is also applied to the surfaces of the electrically-conductive patterns 84. Epoxy resin solvent is employed as the resin material 86, for example. The resin material 86 is subsequently subjected to heat treatment. The application of heat continues for one hour, for example. The temperature of the applied heat is set at 170 degrees Celsius, for example. The resin material 86 gets hardened in response to the applied heat. A buffing process is then effected to wipe the resin material 86 overflowing the through holes 82. At the same time, the surface of the resin material 86 is flushed with the surfaces of the electrically-conductive patterns 84. The second substrate 13 is in this manner established. The thickness of the second substrate 13 is set at 2.3 mm approximately, for example.

Figure 12:
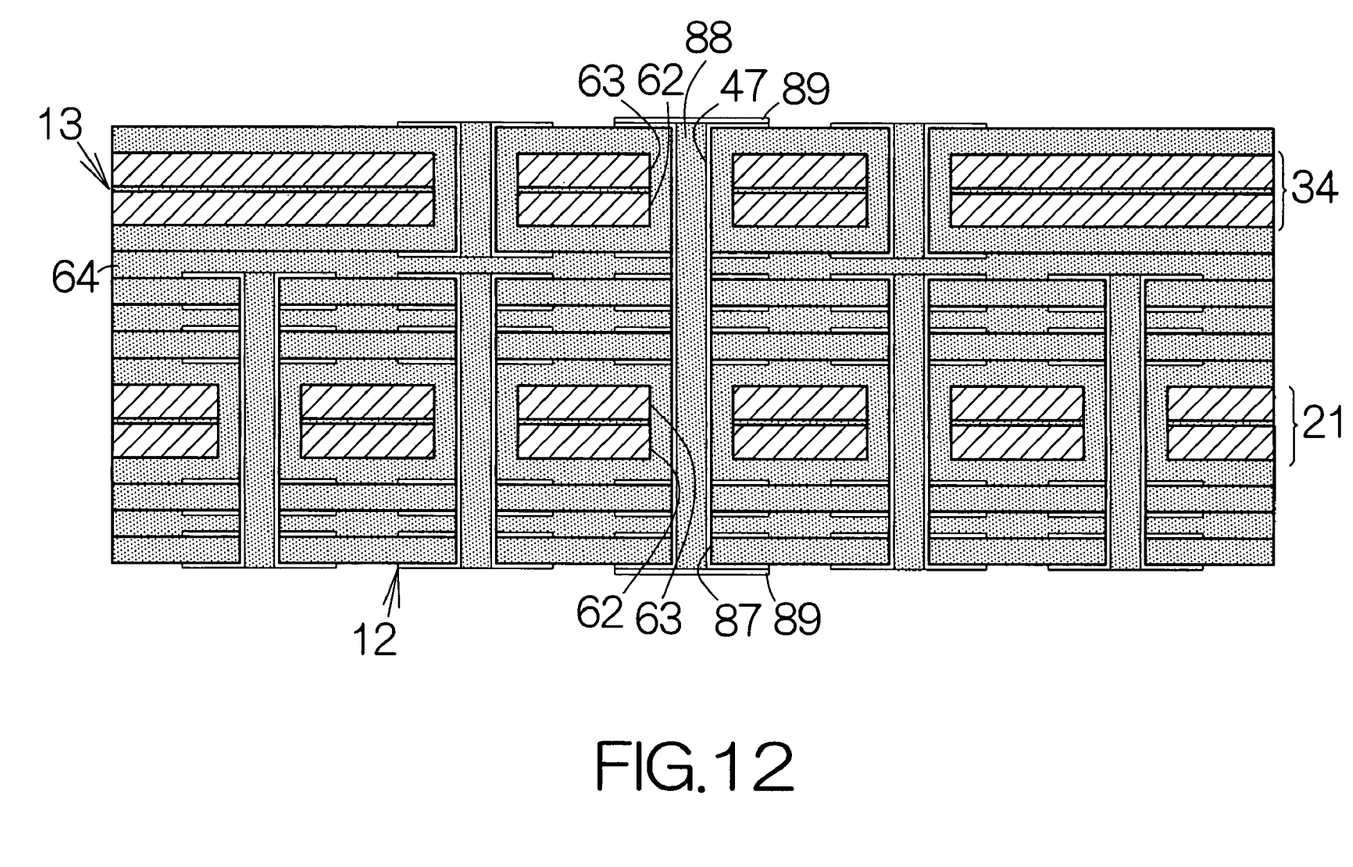
FIG. 12 is an enlarged partial sectional view schematically illustrating the process of overlaying the second substrate on the front surface of the first substrate.

Next, the second substrate 13 is overlaid on the front surface of the first substrate 12, as shown in FIG. 12. The aforementioned prepreg 64 is interposed between the first and second substrates 12, 13. The through holes 62, 63 of the second substrate 13 are aligned with the corresponding through holes 62,63 of the first substrates 12. The second substrate 13 is pressed against the first substrate 12 while heat is applied at least to the prepreg 64. A vacuum press is employed. The vacuum press keeps pressing for one hour, for example. The peak of the temperature of the applied heat is set at 180 degrees Celsius, for example. The pressure is set at $3.92 \times 10^6$ [Pa], for example. Epoxy resin contained in the prepreg 64 gets hardened in response to the applied heat. The hardened epoxy resin serves to bond the first and second substrates 12, 13 to each other. The second substrate 13 is in this manner bonded to the front surface of the first substrate 12.

Next, a through hole 87 is formed in the first and second substrates 12, 13. The through hole 87 penetrates through the through holes 62, 63, 62, 63. A drill is utilized for forming the through hole 87, for example. The diameter of the through hole 87 is set at 0.30 mm approximately, for example. A desmearing process is applied to the inner surface of the through hole 87. A copper seed layer is then formed over the inner surface of the through hole 87. Electroless plating is employed for forming the copper seed layer. A resist film is then formed to pattern electrically-conductive patterns on the surface of the copper seed layer, not shown. Photolithography is employed to pattern the resist film. A copper layer is then plated on the surface of the copper seed layer. Electroplating is employed for forming the copper layer. Etching is subsequently effected to remove the copper seed layer after removal of the resist film. The through-hole via 47 is in this manner established. A resin material 88 is then poured into the through hole 87. Epoxy resin solvent is employed as the resin material 88, for example. The resin material 88 is subsequently subjected to heat treatment. The application of heat continues for one hour, for example. The temperature of the applied heat is set at 170 degrees Celsius, for example. The resin material 88 gets hardened in response to the applied heat. A buffing process is effected to remove the resin material 88 overflowing the through hole 87. At the same time, the surface of the resin material 88 is flushed with the surfaces of the electrically-conductive patterns. A copper layer 89 is then plated on the first and second substrates 12, 13 so as to close the openings of the through hole 87. The entire thickness of the first and second substrates 12, 13 is set at 6.2 mm approximately, for example.

Figure 13:
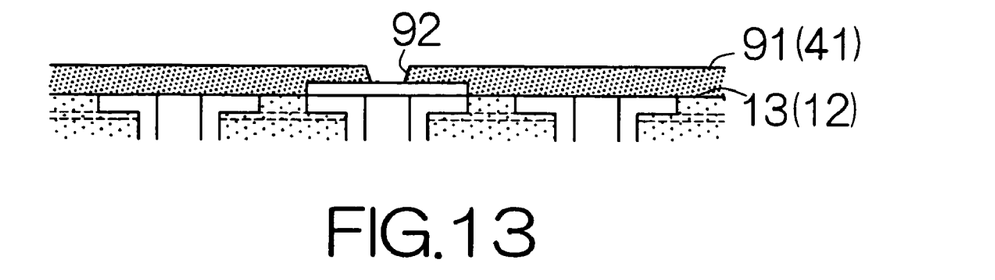
FIG. 13 is an enlarged partial sectional view schematically illustrating the process of forming an insulating layer of a buildup layer on the front surface of the second substrate.

Next, the buildup layers 15, 16 are formed on the back surface of the first substrate 12 and the front surface of the second substrate 13, respectively. The buildup layers 15 is simultaneously formed in the same manner as described below. A resin sheet 91 is first overlaid on the front surface of the second substrate 13, as shown in FIG. 13. The resin sheet 91 is pressed against the front surface of the second substrate 13 under a heated condition. A vacuum press is employed. The vacuum press keeps pressing for half an hour, for example. The temperature of the applied heat is set at 170 degrees Celsius, for example. The resin sheet gets hardened in response to the applied heat. The insulating layer 41 is in this manner established. The thickness of the insulating layer 41 is set at 0.05 mm approximately, for example.

Figure 14:
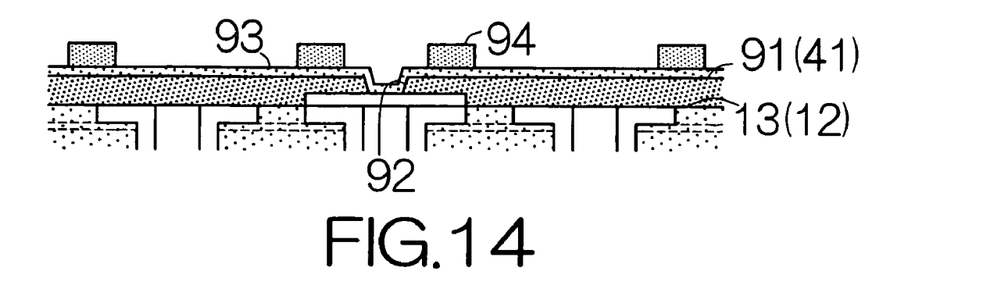
FIG. 14 is an enlarged partial sectional view schematically illustrating the process of forming a copper seed layer and a resist on the surface of the insulating layer.

Next, the electrically-conductive patterns 42 are formed on the surface of the insulating layer 41. Semi-additive process (SAP) is employed for forming the electrically-conductive patterns 42. A predetermined position of the insulating layer 41 is first subjected to irradiation of a UV-YAG laser. A bore 92 is formed in the insulating layer 41 in response to the irradiation. A copper seed layer 93 is then formed over the surface of the insulating layer 41 and the bore 92, as shown in FIG. 14. Electroless plating is employed for forming the copper seed layer 93. A resist film or films 94 are patterned on the surface of the copper seed layer 93.

Figure 15:
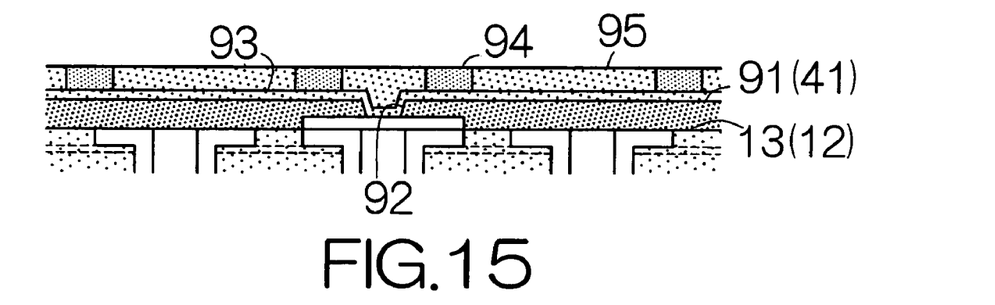
FIG. 15 is an enlarged partial sectional view schematically illustrating the process of forming a copper layer on the surface of the copper seed layer.
Figure 16:
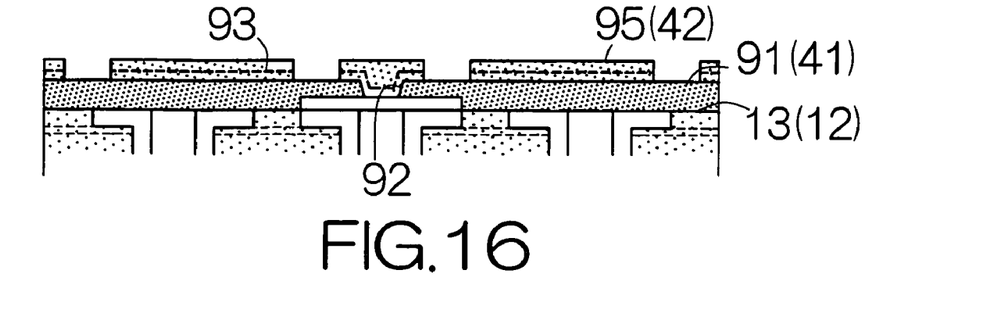
FIG. 16 is an enlarged partial sectional view schematically illustrating the process of forming electrically-conductive patterns and a via.

A copper layer 95 is then plated on the surface of the copper seed layer 93, as shown in FIG. 15. Electroplating is effected to form the copper layer 95. The resist films 94 are then removed, as shown in FIG. 16. This results in exposure of the copper seed layer 93. The exposed surface of the copper seed layer 93 is subjected to etching. The electrically-conductive patterns 42 are in this manner established on the surface of the insulating layer 41. The via 43 is formed inside the bore 92. The processes from the formation of the insulating layer 41 to establishment of the electrically-conductive patterns 42 are repeated a predetermined number of times, four times in this case, for example. The aforementioned electrically-conductive pads 17 are formed on the surface of the buildup layer 15. The buildup layer 15 is in this manner established on the front surface of the second substrate 13.

An overcoat layer, not shown, is overlaid on the surface of the buildup layer 15. A resin material may be employed to form the overcoat layer, for example. Screen printing method or photolithography may be employed to form the overcoat layer, for example. The overcoat layer defines openings at predetermined positions so as to expose the aforementioned electrically-conductive pads 17 on the surface of the buildup layer 15.

Next, the outline of the second substrate 13 is carved inside the outline of the first substrate 12. The second substrate 13 is shaped into a disk having the diameter of 200 mm, for example. Machining may be employed for carve the second substrate 13. This results in establishment of the stepped surface 14 on the front surface of first substrate 12. This establishment of the stepped surface 14 leads to exposure of the electrically-conductive patterns 76 located on the front surface of the first substrate 12. The electrically-conductive pads 18 are formed on the stepped surface 14 based on the exposed electrically-conductive patterns 76. The probe card 11 is in this manner established.

The prepreg 64 is interposed between the fiber reinforced resin plates 61a, 61b for forming the first and second core layers 21, 34 in the aforementioned method. The fiber reinforced resin plates 61a, 61b is pressed against each other while heat is applied to the prepreg 64. A resin material contained in the prepreg 64 is thus allowed to pour into the through holes 62, 63. The through holes 62, 62 are reliably filled up with the resin material. When the through-hole vias 45, 46, 47 are formed inside the through holes 62, 63, the outer surfaces of the through-hole vias 45, 46, 47 can reliably be insulted from the carbon fibers contained in the first and second core layers 21, 36.

On the other hand, a conventional method employs a pair of fiber reinforced resin plates bonded together for forming a core layer. A through hole is then formed in the bonded fiber reinforced resin plates. If the through hole is formed after the fiber reinforced resin plates have been bonded together in this manner, voids tend to be generated over the inside surface of the through hole. Accordingly, when a through-hole via is formed inside the through hole, the voids receive plated copper. This results in an unintentional electrical connection between the through-hole via and the carbon fiber contained in the fiber reinforced resin plates. The through-hole via thus cannot be insulated from the carbon fiber.

The inventors have observed the probe card 11 of the present invention. The average of the coefficient of thermal expansion was calculated for the probe card 11 under the temperature equal to or less than 150 degrees Celsius. The average of the coefficient of thermal expansion was measured in the in-plane direction of an object. A sample including the prepreg 64 and the first and second wiring plates 67, 69 has exhibited 15.0 [ppm/K]. The first or second core layer 21, 34 has exhibited 1.0 [ppm/K]. The sole first substrate 12 has exhibited 2.0 [ppm/K]. The sole second substrate 13 has exhibited 1.5 [ppm/K]. A sample including the first and second substrates 12, 13 has exhibited 2.0 [ppm/K]. The sole insulating layer 29, 41 of the buildup layer 15, 16 has exhibited 70.0 [ppm/K]. The probe card 11 has exhibited 4.0 [ppm/K]. A sufficient reduction in the coefficient of thermal expansion can thus be obtained not only in the final probe card 11 but also in the probe card 11 during the ongoing processes. A sufficient reduction in the coefficient of thermal expansion can be obtained in the overall probe card 11 even though the material including the prepreg 64 and the first and second wiring plates 67, 69 as well as the insulating layer 29, 41 of the buildup layer 15, 16 suffers from a larger coefficient of thermal expansion.

Next, the inventors have measured the amount of warp of the probe card 11. The inventors prepared a specific example of the invention and a comparative example. The specific example was made in accordance with the aforementioned method of the present invention. The comparative example employed first and second core layers made of BT resin in place of the first and second core layers 21, 34 in the probe card 11 of the present invention. The amount of warp was measured on the front surface of the second substrate 13 over the span of 20 mm. The probe card 11 according to the specific example of the invention has exhibited a warp equal to or smaller than 10 µm. The probe card according to the comparative example has exhibited a warp of 30 µm. The probe card 11 according to the specific example is allowed to enjoy a reduction in warp as compared with the probe card according to the comparative example.

Next, the inventors have carried out temperature cycle test on the probe card 11 of the present invention. The probe card 11 according to the aforementioned specific example was prepared. The probe card 11 was placed in a vapor phase. Temperature cycle was repeated 300 times between −40 degrees Celsius and 150 degrees Celsius in the vapor phase. The inventors have also carried out high temperature test, namely burn-in test. The probe card 11 was first placed in the atmosphere of 150 degrees Celsius for 1,000 hours. The resistance of the inner wiring of the probe card 11 was measured. Rate of change in the resistance was calculated based on the measured resistance. Deviation was calculated between the measured resistance and the theoretical resistance. The rate of change falls within 10%, so that it has been confirmed that the wiring was completely maintained in the probe card 11. The probe card 11 was prevented from break of wiring or failure in inside connections regardless of the aforementioned temperature condition.

Next, the inventors have observed the reliability of connection between the probe card 11 of the present invention and a semiconductor wafer. The probe card 11 according to the aforementioned specific example was prepared again. Contact pins were soldered to the electrically-conductive pads 17 located on the front surface of the second substrate 13 in the probe card 11 according to the specific example. A semiconductor wafer was mounted on the probe card 11. The electrodes of the semiconductor wafer were received on the contact pins on the probe card 11. Electrical connection was in this manner established between the electrodes of the semiconductor wafer and the contact pins. Temperature cycle was then repeated between the normal or room temperature and 150 degrees Celsius. Electric current was supplied to semiconductor wafer through the probe card 11. The electric resistance was measured for the probe card 11 and the semiconductor wafer. Rate of change in the electric resistance was calculated based on the measured resistance as described above. The rate of change fell within 10%, so that it has been confirmed that a reliable connection could be maintained between the electrodes of the semiconductor wafer and the contact pins. It has also been confirmed that no failure could be caused in the connection between the semiconductor wafer and the probe card 11 regardless of the aforementioned temperature condition. In other words, it has been confirmed that the electrodes of semiconductor wafer were surely prevented from shifting from the positions corresponding to the contact pins regardless of a thermal expansion of the semiconductor wafer and the probe card 11.

What is claimed is:

1. A printed wiring board comprising:
   a first substrate including a core layer made of resin containing carbon fibers;
   a second substrate superimposed on a surface of the first substrate, said second substrate including a core layer containing carbon fibers, said second substrate having an outline different from an outline of the first substrate so that a stepped surface is formed on the first substrate; and
   an electrically-conductive pad exposed on the stepped surface,
   wherein the core layer of the second substrate comprises:
      a first resin layer made of a resin material containing carbon fibers, said first resin layer defining a through hole at a predetermined position;
      an insulating layer overlaid on a surface of the first resin layer, said insulating layer made of a resin material containing glass fibers; and
      a second resin layer overlaid on a surface of the insulating layer, said second resin layer made of a resin material containing carbon fibers, said second resin layer defining a through hole at a position aligned with the through hole defined in the first resin layer.

2. The printed wiring board according to claim 1, wherein the second substrate is located inside the outline of the first substrate.

3. The printed wiring board according to claim 1, further comprising a buildup layer overlaid on a surface of the second substrate, said buildup layer including an insulating layer and an electrically-conductive pattern.

4. The printed wiring board according to claim 3, wherein an additional electrically-conductive pad is exposed on a surface of the buildup layer.

5. The printed wiring board according to claim 1, wherein the first substrate further comprises:
   an insulating layer overlaid on a surface of the core layer, said insulating layer containing glass fibers; and
   an electrically-conductive pattern located on a surface of the insulating layer.

6. A printed wiring board comprising:
   a first substrate including a core layer made of resin containing carbon fibers;
   a second substrate superimposed on a surface of the first substrate, said second substrate including a core layer made of resin containing carbon fibers; and
   a buildup layer superimposed on an upper surface of the second substrate, said buildup layer including an insulating layer and an electrically-conductive pattern,
   wherein the core layer of the second substrate comprises:
      a first resin layer made of a resin material containing carbon fibers, said first resin layer defining a through hole at a predetermined position;
      an insulating layer overlaid on a surface of the first resin layer, said insulating layer made of a resin material containing glass fibers; and
      a second resin layer overlaid on a surface of the insulating layer, said second resin layer made of a resin material containing carbon fibers, said second resin layer defining a through hole at a position aligned with the through hole defined in the first resin layer.

7. The printed wiring board according to claim 6, wherein an electrically-conductive pad is exposed on a surface of the buildup layer.

8. The printed wiring board according to claim 6, wherein the first substrate further comprises:
   an insulating layer overlaid on a surface of the core layer, said insulating layer containing glass fibers; and
   an electrically-conductive pattern located on a surface of the insulating layer.

9. A printed wiring board comprising:
   a first substrate comprising:

a first resin layer made of a resin material containing carbon fibers, a first insulating layer overlaid on a surface of the first resin layer, and a second resin layer made of a resin material containing carbon fibers overlaid on a surface of the first insulating layer, and a second substrate overlaid on a front surface of the first substrate comprising:

a third resin layer made of a resin material containing carbon fibers, a second insulating layer overlaid on a surface of the third resin layer, and a fourth resin layer made of a resin material containing carbon fibers overlaid on a surface of the second insulating layer.

10. The printed wiring board according to claim 9, further comprising:

a buildup layer including an insulating layer and an electrically-conductive pattern overlaid on a back surface of the first substrate; and a buildup layer including an insulating layer and an electrically-conductive pattern overlaid on a front surface of the second substrate.

* * * * *